United States Patent [19]
Frick

[11] 3,975,719
[45] Aug. 17, 1976

[54] TRANSDUCER FOR CONVERTING A VARYING REACTANCE SIGNAL TO A DC CURRENT SIGNAL

[75] Inventor: Roger L. Frick, Eden Prairie, Minn.

[73] Assignee: Rosemount Inc., Minneapolis, Minn.

[22] Filed: Jan. 20, 1975

[21] Appl. No.: 542,124

[52] U.S. Cl. ............................... 340/200; 340/186; 340/210
[51] Int. Cl.² ...................................... G08C 19/10
[58] Field of Search .................... 340/200, 210, 186

[56] References Cited
UNITED STATES PATENTS

| | | | |
|---|---|---|---|
| 3,051,933 | 8/1962 | Cressey | 340/210 |
| 3,456,132 | 7/1969 | Dechelotte | 340/210 |
| 3,517,556 | 6/1970 | Barker | 340/210 |
| 3,560,948 | 2/1971 | Inose | 340/210 |
| 3,562,729 | 2/1971 | Hurd | 340/210 |
| 3,626,274 | 12/1971 | Christofzik | 340/210 |
| 3,646,538 | 2/1972 | Frick | 340/200 |
| 3,683,344 | 8/1972 | Saito | 340/210 |
| 3,742,342 | 6/1973 | Schick | 340/210 |
| 3,859,594 | 1/1975 | Grindheim | 340/186 |

*Primary Examiner*—Thomas B. Habecker
*Attorney, Agent, or Firm*—Dugger, Johnson & Westman

[57] ABSTRACT

A two wire current transmitter providing a current signal representing a parameter measured by a variable reactance transducer along the same two wires that are used to carry excitation power to the circuit. The reactance is measured by a circuit providing a DC signal which controls a current control stage to modify the total current through the two wires. The current control stage has a small number of components and operates on a relatively low voltage.

23 Claims, 2 Drawing Figures

TRANSDUCER FOR CONVERTING A VARYING REACTANCE SIGNAL TO A DC CURRENT SIGNAL

BACKGROUND OF THE INVENTION

1. Field of the Invention

This invention relates to a two wire transmitter where the DC excitation to the transmitter is amplitude controlled in response to a varying reactance such as a capacitance pressure sensor so that the DC current serves both as excitation and as the electrical signal representative of the sensed pressure.

2. Description of the Prior Art

Two wire circuitry for converting a varying AC reactive impedance to a current signal is described in my U.S. Pat. No. 3,646,538 and this disclosure shows certain improvements over that prior disclosure.

SUMMARY OF THE INVENTION

This invention comprises a circuit for accurately providing a current signal in proportion to a variable reactance to be measured. The circuit includes an oscillator and rectifying means in circuit with the reactance to provide a DC signal as a function of the reactance, a resistance network providing a current signal proportional to the total current drawn by the circuit and a controller stage to vary the total current as a function of the variable reactance.

The invention is particularly suited for measurement with a capacitive pressure sensor where only one active capacitor is employed and where the total DC level to the circuit is to be linear with the pressure being measured.

This circuit employs current summing in both the oscillator control stage and the output stage to minimize amplifier offset errors. Also, largely due to an improved output stage, the voltage required for circuit operation is relatively low and the required number of components is significantly reduced compared to the prior art.

BRIEF DESCRIPTION OF THE DRAWINGS

FIG. 1 is a schematic representation of a circuit which provides control of the current supplied to the circuit in a functional relation to a variable capacitor.

DESCRIPTION OF THE PREFERRED EMBODIMENT

Figure 2:
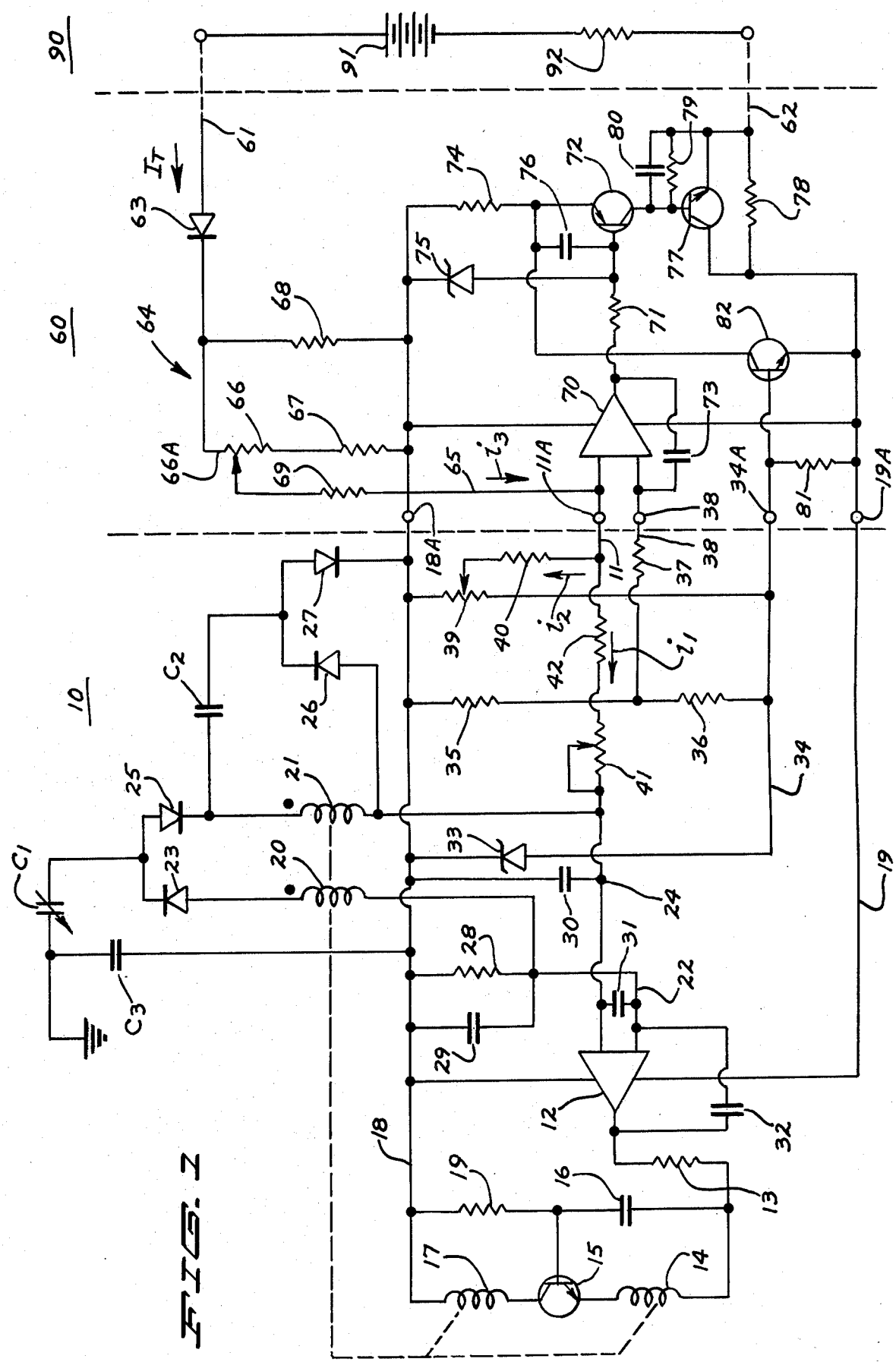
FIG. 2 is a schematic representation of an alternate oscillator control stage where a variable inductor rather than a variable capacitor provides a signal to the output stage.
Figure 2:
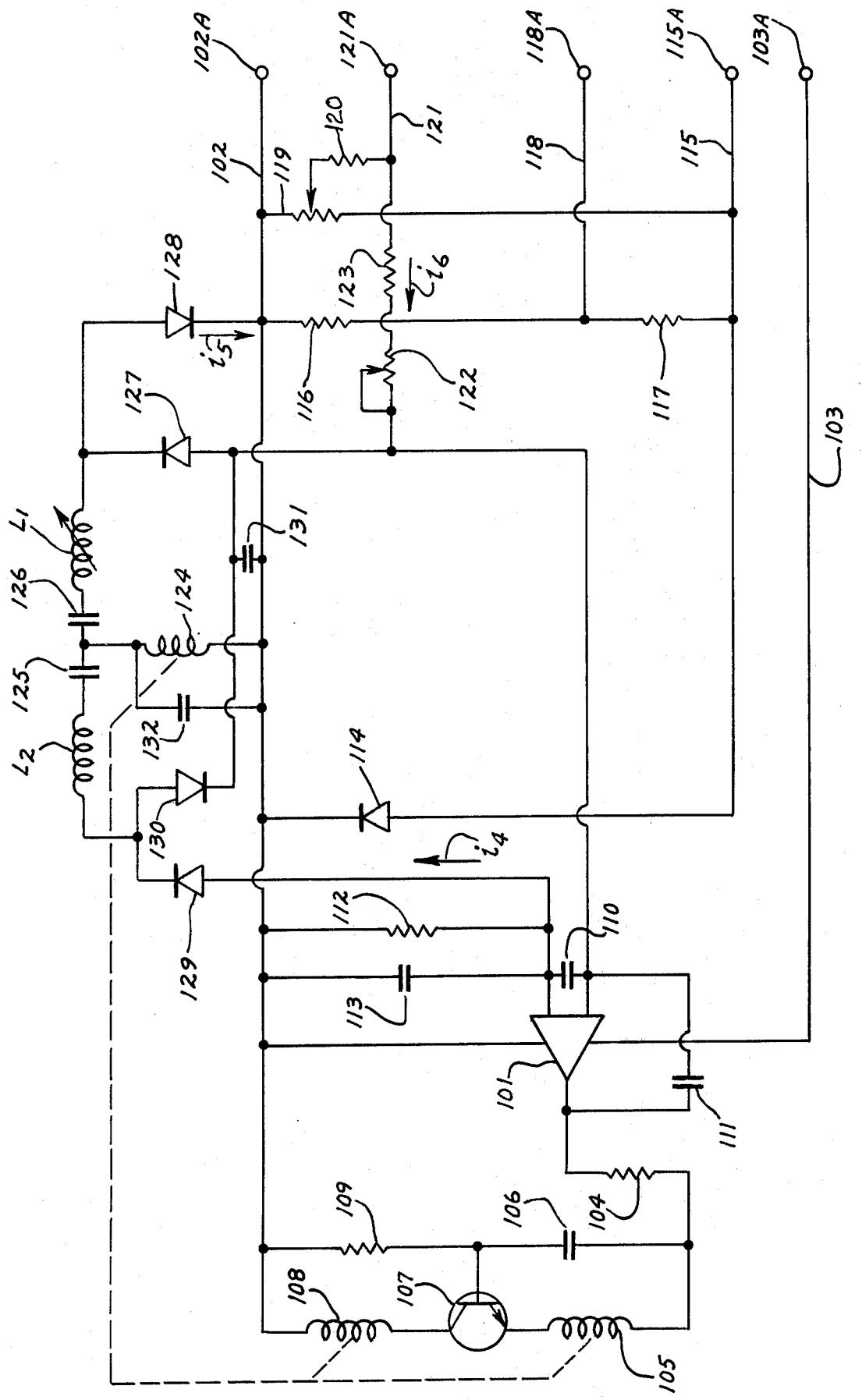

The preferred embodiment is shown in detail in FIG. 1 where $C_1$ represents a capacitance pressure sensor having only one active capacitor. Such a pressure sensor is described in my copending application, Ser. No. 457,697, filed Apr. 4, 1974, where a diaphragm moves in response to pressure changes and provides a varying capacitance which is inversely related to pressure and which decreases with increasing pressure. Then it is desirable to provide a circuit which gives an increasing DC signal inverse to decreasing capacitance so the resulting function is an electrical output linearly proportional to pressure. The described circuit performs this function and also discloses a current control stage which when used in conjunction with the DC signal producing circuit provides control of the excitation current amplitude in proportion to the DC signal. This circuit together with a sensor providing the capacitance signal $C_1$ is referred to as a two wire transmitter since the total excitation signal and the signal proportional to the parameter being measured comprises a direct current carried on only two wires.

Referring to FIG. 1, the complete circuit comprises three main portions separated by dashed lines and generally depicted as an input circuit 10, a current control circuit 60 and an excitation circuit 90.

OPERATION OF THE INPUT CIRCUIT OF FIG. 1

The input circuit includes a varying capacitor $C_1$ and a reference capacitor $C_2$; an oscillator and associated rectifying components to provide DC signals proportional to the capacitors; a source of reference voltage $V_R$; and connecting circuitry to provide a desired function between $C_1$ and a DC output signal at line 11.

The oscillator provides repetitive charging and discharging currents or current pulses to each of the capacitors $C_1$ and $C_2$ and the oscillator output in terms of the product of frequency and voltage provided thereby, is controlled by the voltages at the inputs to amplifier 12. The output of amplifier 12 connects through a coupling resistor 13 to a first end of an oscillator feedback winding 14. The other end of the feedback winding 14 connects to the emitter of a transistor 15. A capacitor 16 is connected between the base of transistor 15 and the first end of winding 14. An oscillator primary winding 17 is connected between the collector of transistor 15 and a line 18. A resistor 19 is also connected between line 18 and the base of transistor 15. Amplifier 12 is energized by connecting its power terminals between current supply line 18 and power return line 19.

Primary winding 17 is electrically coupled to secondary windings 20 and 21, which provide the repetitive currents to capacitors $C_1$ and $C_2$. Winding 20 is connected at one end to a line 22 and the other end connects through a forward conducting diode 23 to a first side of capacitor $C_1$. The other side of capacitor $C_1$ connects to line 18 through a coupling capacitor $C_3$ which provides DC isolation between the grounded sensor ($C_1$) and the connected circuit. This allows the use of a grounded power supply or receiver and a grounded capacitor $C_1$. A first end of winding 21 is connected to a line 24 and a second end of the winding connects through a reverse conducting diode 25 (it conducts current from $C_1$) to the first side of capacitance $C_1$. The first end of winding 21 also connects through a forward conducting diode 26 to a first side of capacitor $C_2$. The first side of capacitor $C_2$ is also connected through a forward conducting diode 27 to the line 18. The other side of capacitor $C_2$ is connected to the second end of winding 21. A resistor 28 and a parallel capacitance 29 are connected between line 18 and line 22 and a capacitor 30 is also connected between line 18 and line 24. A capacitor 31 is connected between lines 24 and 22 which lines are connected to the noninverting and inverting input terminals, respectively, of amplifier 12. A feedback capacitor 32 connects between line 22 and the output of amplifier 12.

In operation the currents associated with capacitors $C_1$ and $C_2$ are pulsating DC signals (also called current pulses) having an average amplitude directly proportional to the product of peak applied voltage, frequency of the pulses and capacitance so long as the peak voltages are of sufficient duration to substantially fully charge the capacitors during each cycle and neglecting the forward volt drop of the connected diodes. The DC current passing through diodes 23 and 25 then is equal to $fVC_1$ where V is the peak to peak voltage and $f$ is frequency of the AC excitation at windings 20 and 21. Similarly, the DC current through diodes 26 and 27 is $fVC_2$. The voltage on line 24 with respect to line 18 is substantially fixed and may be termed $V_1$. The polarity of the input signals to amplifier 12 is such that an increased output from amplifier 12 provides increased current through diodes 23 and 25 and a decreased potential at line 22. Thus the potential of line 22 remains substantially equal to $V_1$ and the DC current through diodes 23 and 25 equals the current through resistor 28 so that $$fVC_1 = V_1/R_{28} \qquad (1)$$

and the oscillator control provides the equality $$fV = V_1/C_1R_{28}. \qquad (2)$$

The input circuit includes a Zener diode 33 connected between line 18 and a power return line 34, and a pair of fixed value resistors 35 and 36 are connected in series across diode 33. The junction of resistors 35 and 36 connects through a resistor 37 to a line 38 and the fixed value voltage at line 38 with respect to line 18 is designated $V_R$. A zeroing potentiometer 39 is connected between line 18 and line 34 and the wiper of the potentiometer is connected through a resistor 40 to line 11. Potentiometer 41 and a resistor 42 are connected in series between line 11 and line 24. The wiper of potentiometer 41 is connected to one end of the potentiometer so it functions as a variable resistor to provide a linearizing characteristic as further described below.

The direct current $i_1$ through potentiometer 41 and resistor 42 is made up of currents passing through diodes 23 and 25 and also through diodes 26 and 27 and thus $i_1 = fV(C_2-C_1)$. This input circuit also includes a zeroing current $i_2$ which passes from line 11 through resistor 40 as shown. Then the current on line 11 is $i_2 + i_1$ or $i_2 + fV(C_2-C_1)$ and since $fV = V_1/C_1R_{28}$ this current may be expressed as $$i_2 + i_1 = i_2 + \frac{V_1}{R_{28}}\left(\frac{C_2}{C_1} - 1\right). \qquad (3)$$

The voltage $V_1$ is somewhat dependent upon $C_2/C_1$ since $V_1 = V_R + i_1(R_{41} + R_{42})$ under the assumption that the voltage on line 11 substantially equals the voltage $V_R$ on line 38. Consequently the value of $R_{41(e)} + R_{42}$ provides a selectable term which may be used to modify the expression for $i_2 + i_1$. This modifying action is actually used to provide linearization to the overall transfer function, that is, the relationship between output current and measured parameter, which is desirable due to unavoidable shunting capacitance across $C_1$ and other factors such as slight nonlinearity of a pressure diaphragm for example. This input circuit as described provides a current signal on line 11 which is substantially proportional to the expression $C_2/C_1$ and which includes zeroing and linearizing features. The reference or fixed voltage $V_R$ is supplied on line 38.

OPERATION OF THE CURRENT CONTROL CIRCUIT

The current conrol circuit 60 is powered via power supply line 61 and power return line 62 and its basic function is to provide energization to the input circuit 10 and to provide control of the total circuit current $I_T$ in line 61 as a function of the condition being measured. It can be looked at as being connected to the input circuit at terminals 18A, 11A, 38A, 34A and 19A.

The total current $I_T$ passes through a reversal protection diode 63 and thence through a resistor network 64 to line 18 except for a known portion, $i_3$, of the total current $I_T$ which is carried via line 65 to line 11. Resistor network 64 compises a series combination of a potentiometer 66 and a resistor 67 connected in parallel with a resistor 68 between diode 63 and line 18. The wiper of potentiometer 66 connects through resistor 69 and line 65 to line 11. An amplifier 70 is energized by connection between lines 18 and 19 and has its output connected through a resistor 71 to the base of a current control transistor 72. The noninverting input of amplifier 70 connects to line 11 and the inverting input is connected to line 38. A capacitor 73 is connected between the inverting input and the output of amplifier 70. The emitter of transistor 72 connects to power supply line 18 via resistor 74 and a current limiting diode 75 is connected between line 18 and the base of transistor 72. If the current through resistor 74 exceeds a certain value, diode 75 will conduct and limit transistor 72 thereby limiting the current and acting as a protective feature. A capacitor 76 is connected across the base and emitter of transistor 72 to provide dynamic stability. The collector of transistor 72 connects to the base of a transistor 77 and the emitter of transistor 77 connects to power return line 62. The collector of transistor 77 connects to line 19 and a resistor 78 is connected between lines 19 and 62. Resistor 78 serves as a current bypass and is active upon energization of the circuit. A resistor 79 and a parallel connected capacitor 80 are connected between the base and emitter of transistor 77 to filter oscillator noise from the output. A resistor 81 is connected between lines 34 and 19 and a transistor 82 has its base connected to line 34 and emitter connected to line 19. The collector of transistor 82 is connected to the emitter of transistor 72. Transistor 82 and resistor 81 serve to stabilize the current through Zener diode 33.

In operation a known current portion $i_3$ of the total current $I_T$ passes to line 11 through resistor 69. An increasing signal on line 11 at the noninverting terminal of amplifier 70 provides a decreasing signal at the base of transistor 72 and the base of transistor 77 and this reduces the current flow through transistor 77 and network 64. Thus current $i_3$ also then reduces to tend to maintain a fixed voltage on line 11 equal to the voltage $V_R$ on line 38. Also, $i_3 = i_1 + i_2$ and $i_3R_{69} = I_TR_z + V_R$, where $$R_z = \frac{R_{68}(R_{66} + R_{67})}{R_{66} + R_{67} + R_{68}}$$

if potentiometer 66 has its wiper turned up to the top end 66A. Turning the wiper down would modify the expression for $R_z$ and cause it to decrease but the relationship between $i_3$ and $I_T$ remains proportional. Thus potentiometer 66 acts as a span or sensitivity control since it is a multiplier of the total current $I_T$. Combining the above expression with the earlier derived expression for $i_2 + i_1$ (equation 3) gives $$I_T = \frac{V_1 R_{69}}{R_{28} R_z} \left(\frac{C_2}{C_1} - 1\right) + i_2 \frac{R_{69}}{R_z} - \frac{V_R}{R_z} \quad (4)$$

where $V_1$ bears the previously described relation to $V_R$ and $i_2$ is a zeroing current level selected via potentiometer 39.

EXAMPLE

As a specific example an excitation circuit 90 comprising a DC power supply 91 and a load resistor 92 was connected as shown to lines 61 and 62 to provide a positive current flow in the direction of arrow $I_T$. Capacitor $C_1$ was varied between approximately 82 pf and 50 pf to represent zero to full scale pressure signals from a capacitive pressure sensor and $C_2$ was 82 pf. Other component values are given in Table 1. Power supply voltage requirements between lines 61 and 62 was found to be 12 volts minimum and about 35 volts maximum. The output current could be set to 4 ma with potentiometer 39 when $C_1$ and $C_2$ were equal and the span could be set with potentiometer 66 to provide 20 ma total current when $C_1$ was approximately 50 pf. Linearity of $I_T$ versus $C_2/C_1$ could be adjusted with potentiometer 41.

The transmitter provides basically three current paths between lines 18 and 62. The shunt current, which is controlled by amplifier 70 passes from line 18 to resistor 74, and transistor 82, and then through transistor 77, which is the final current control element.

A second regulated current path is provided from line 18 through Zener diode 33 and parallel resistive paths including resistors 35, 36 and 39 to line 34. Line 34 is connected to the base of transistor 82 and to resistor 81, and this combination serves to regulate the current through Zener diode 33 at a substantially constant level so the reference voltage provided by Zener diode 33 does not vary significantly with increased current. Resistor 81 can be made temperature compensating to compensate for temperature caused changes in the base to emitter voltage drop of transistor 82.

A third current path is not regulated and comprises the paths through the power connections for amplifiers 12 and 70 from line 18 to line 19.

The current control as shown also is accomplished through two stages. The first stage comprises transistor 72 which is directly responsive to the output of amplifier 70. The transistor 72 provides a control signal for the second stage transistor 77, which is the final current control.

The signal provided on line 65 from the resistance network is the current sensitive balancing feedback signal sensed at the input of amplifier 70 when the amplifier has adjusted the current in the shunt path in response to changes in the signal on line 11 due to a change in the output of the transducer.

The use of the particular current regulating circuit disclosed, comprising transistor 82 and resistor 81 is advantageous because it provides necessary regulation with minimum voltage drop. This allows a higher magnitude of feedback voltage developed across resistor 68 and hence at the noninverting input of amplifier 70 when used in a typical two wire control loop where the voltage available for transmitter excitation is 12 volts minimum, as an accepted standard.

TABLE 1

| | Symbol | Value and/or Type |
|---|---|---|
| Capacitors: | $C_3$ | 0.022μf |
| | 16 | 0.0047μf |
| | 29, 30, 73, 80 | 0.1μf |
| | 31, 32, 76 | 1.0μf |
| Resistors: | 13, 37, 74 | 100Ω |
| | 19 | 68K |
| | 28 | 4.53K |
| | 35, 69 | 13.7K |
| | 36 | 60.4K |
| | 40 | 30.1K |
| | 42 | 750Ω |
| | 67, 68 | 200Ω |
| | 71 | 680Ω |
| | 78 | 8.2K |
| | 79 | 6.8K |
| | 81 | 330Ω |
| Potentiometers: | 39 | 20K |
| | 41 | 1K |
| | 66 | 2K |
| Diodes: | 23, 25, 26, 27 | 1N914 |
| | 33 | 1N4571A |
| | 63 | 1N4003 |
| | 75 | 1N747A |
| Transistors: | 15 | MPS 5172 |
| | 72 | 2N722 |
| | 77 | 2N3019 |
| | 82 | 2N3903 |
| Amplifiers: | 12, 70 | 741C |
| Transformer Windings: | 14 | Feedback — 5 turns |
| | 17 | Primary — 19 turns |
| | 20, 21 | Secondaries—200 turns bifilar wound Core — 768 T 188 3D3 — Ferroxcube |

OPERATION OF THE INPUT CIRCUIT OF FIG. 2

The circuit of FIG. 2 is an alternate arrangement of the oscillator control stage adapted for measurement of a variable inductance. As shown a current signal is provided which is proportional to the reciprocal of the variable inductor. This relation is applicable for example if the variable inductance is generated by a pressure sensor having a magnetic path passing between a movable diaphragm and a stationary pole piece so that the inductance varies inversely with diaphragm deflection.

An oscillator similar to the oscillator of FIG. 1 comprises a control amplifier 101 energized by connecting it between lines 102 and 103. The output of amplifier 101 connects through a resistor 104 to the junction of a feedback winding 105 and a capacitor 106. The other end of winding 105 connects to the emitter of a transistor 107 and the other side of capacitor 106 connects to the base of transistor 107. A primary winding 108 is connected between the collector of transistor 107 and line 102 and a resistor 109 is connected between the base of transistor 107 and line 102. A capacitor 110 is connected across the inputs to amplifier 101 and a capacitor 111 is connected between the inverting input and the output of amplifier 101. A resistor 112 and a capacitor 113 are connected in parallel and between the noninverting input of amplifier 101 and line 102. A Zener diode 114 is connected between line 102 and a line 115 and the diode 114 is in parallel with the series combination of resistors 116 and 117. The junction between resistors 116 and 117 is connected to a line 118 and a reference voltage is thus provided thereon. A zeroing potentiometer 119 is also connected between lines 102 and 115 and the wiper of potentiometer 119 connects through resistor 120 to line 121. One end of a linearizing potentiometer 122 connects to the inverting terminal of amplifier 101 and the other end of potentiometer 122 connects through a resistor 123 to line 121. The circuit description and operation to this point is identical to the circuit of FIG. 1 and lines 102, 121, 118, 115 and 103 correspond respectively to lines 18, 11, 38, 34 and 19 of FIG. 1. Terminals 102A, 121A, 118A, 115A and 103A provide connection for the output stage 60 of FIG. 1 in place of terminals 18A, 11A, 38A, 34A, and 19A, respectively.

In order to generate the required function from a varying inductor however, the inductors and associated rectifying circuits require changes in circuit when compared to the variable and fixed capacitors $C_1$ and $C_2$ of FIG. 1.

A single secondary winding 124 is connected between line 102 and the junction of DC blocking capacitors 125 and 126 at first sides thereof. The second side of capacitor 126 is connected to a first end of an inductor $L_1$ and the second side of capacitor 125 is connected to a first end of inductor $L_2$. The second end of inductor $L_1$ is connected to the cathode of a diode 127 and to the anode of a diode 128. The cathode of diode 128 connects to line 102 and the anode of diode 127 connects to the inverting terminal of amplifier 101. The second end of inductor $L_2$ is connected to the cathode of a diode 129 and to the anode of a diode 130. The cathode of diode 130 connects to the anode of diode 127 and the anode of diode 129 connects to the noninverting terminal of amplifier 101. Bypass capacitor 131 is connected between line 102 and the noninverting terminal of amplifier 101 and another capacitor 132 is connected across secondary winding 124 to set the resonant frequency.

The operation of this circuit is similar to the circuit of FIG. 1 in that AC impedances are energized by an oscillator circuit and rectifying loops provide DC signals proportional to the inductors. In this example a DC current $i_4$ passes through diodes 129 and 130 and $i_4 = KV/L_2$ where $V$ is peak voltage from winding 124, and $K$ is a function of frequency and waveform of the voltage. Similarly a current $i_5 = KV/L_1$ passes through diodes 127 and 128. A current $i_6$ passing through resistor 123 and potentiometer 122 represents the difference between $i_5$ and $i_4$ and is seen to be $$i_6 = KV \left( \frac{1}{L_1} - \frac{1}{L_2} \right).$$

The current through resistor 112 is also $i_4$ and calling the voltage at the inverting terminal of amplifier 101 $V_1$ similar to FIG. 1 gives $KV/L_2 = V_1/R_{112}$. Then substituting in the expression for $i_6$ gives $$i_6 = \frac{V_1 L_2}{R_{112}} \left( \frac{1}{L_1} - \frac{1}{L_2} \right) = \frac{V_1}{R_{112}} \left( \frac{L_2}{L_1} - 1 \right)$$

which is the desired signal current as a function of the variable inductor $L_1$ and which corresponds to the signal current $i_1$ of FIG. 1. If a linear relation was desired between an inductor and $i_6$, $L_2$ could be selected as the variable inductor. If differential deflection of a pressure diaphragm was to be measured and assuming again that deflection is inversely related to inductance, this could also be accomplished with slight circuit changes providing a different combination of rectified current to give $i_6 \propto X_1 - X_2$ where $X_1$ is the deflection corresponding to $L_1$ and $X_2$ is the deflection corresponding to $L_2$.

What is claimed is:

1. A two wire current transmitter for providing a direct current signal proportional to a condition to be measured comprising first and second terminals for connection to a direct current supply means; a resistance network connected to said first terminal; a current controller in series with the resistance network and connected to said second terminal, said current controller comprising first means connected to the resistance network to provide a current shunt path between said resistance network and said second terminal, and amplifier means having an input and an output, said amplifier means output being coupled to said first means to control the current through said first means as a function of signals at said amplifier means input, and second means connected to said resistance network and said amplifier means to provide a signal at the input of said amplifier means which is a function of the current through said resistance network; an input means connected between said first and second terminals including means defining at least two separate current paths, at least one of which is a regulated current path, and including a transducer to provide an electrical signal in response to a parameter to be measured, said input stage means being coupled to said resistance network and to said input of said amplifier means of the current controller and providing an excitation current to said transducer, a Zener diode connected in the regulated current path to provide a precise reference voltage across said Zener diode, a resistance voltage divider connected directly across said Zener diode, said resistance voltage divider having a voltage signal connection connected to said input of said amplifier means; said current controller comprising means to regulate the current in said regulated current path comprising a transistor having a collector, an emitter and a base and being connected to transmit between its collector and emitter a portion of the current passing through said shunt path, and a resistor connected between the base and emitter of said transistor, the base of said transistor being connected to said regulated current path; and said input stage means including fourth means to provide an output signal to the input of said amplifier means which is a function of the parameter to be measured, said amplifier means thereby adjusting current through said first means and said second means in response to the output signal of said input stage means.

2. The current transmitter of claim 1 wherein said input stage means includes an oscillator to provide an alternating excitation signal to said transducer.

3. The current transmitter of claim 2 wherein said oscillator includes a control amplifier having an input means coupling the intput of said control amplifier to the input stage to provide a signal to the control amplifier which is a function of the electrical signal provided by said transducer.

4. The current transmitter of claim 2 wherein said transducer comprises a variable reactance transducer sensitive to a physical condition to be measured, and means to connect the oscillator output to said variable reactance transducer.

5. The combination as specified in claim 4 and further means to connect said variable reactance transducer to provide DC signals from said transducer comprising the output signal of said input stage.

6. The combination as specified in claim 5 wherein said oscillator includes a control amplifier, and means to connect said further means to an input of said control amplifier.

7. The combination as specified in claim 5 wherein said variable reactance transducer comprises a variable capacitance element.

8. The combination as specified in claim 5 wherein said variable reactance transducer comprises a variable reluctance element.

9. The combination as specified in claim 7 wherein said variable capacitance element reduces in capacitance with respect to an increase in value of the parameter being measured.

10. The combination as specified in claim 1 wherein the separate current path, other than said regulated current path, comprises an unregulated current path providing power to said transducer.

11. The combination as specified in claim 10 wherein said shunt current path includes current amplifier means which carries the current from said separate paths and said shunt path.

12. The combination as specified in claim 1 wherein said amplifier means comprises an operational amplifier having a pair of inputs, means connected to one of said inputs to provide a reference voltage thereto, said second means being connected to the other of said inputs of said differential amplifier and said other input also being connected to receive said output signal of the input stage.

13. The combination as specified in claim 12 wherein said current controller, includes transistor means having a base coupled to the output of said operational amplifier, and having its collector-emitter circuit connected to pass current from said separate current paths and said shunt path and control the current through said shunt path in response to the output of said operational amplifier.

14. The combination as specified in claim 4 wherein said oscillator includes an oscillator control amplifier, said oscillator control amplifier having an input, means connected to said variable reactance transducer to provide a pulsating DC current output from said transducer as a function of the reactance thereof and means connecting the ouput of said variable reactance transducer to the input of said oscillator control amplifier.

15. The combination of claim 14 wherein said variable reactance transducer comprises a single variable capacitor having a capacitance value $C_1$, a reference capacitor having a capacitance value $C_2$, means connecting said oscillator to both of said capacitors, and means connected to said capacitors to deliver the output of said input stage as a signal proportional to the quantity $(C_2/C_1) - 1$.

16. The current transmitter as claimed in claim 1 wherein said resistor comprises temperature sensitive resistance material.

17. The current transmitter as claimed in claim 1 wherein said current shunt path includes a second transistor having its collector-emitter circuit in series with the collector-emitter path of said first mentioned transistor.

18. The current transmitter as claimed in claim 17 and a third transistor having its collector-emitter circuit connected between the base of said second transistor and the collector of said first mentioned transistor and having its base connected to the output of said amplifier means.

19. The current transmitter as claimed in claim 18 wherein said input stage means includes an oscillator to provide an alternating excitation signal to said transducer, said transducer comprising a variable capacitance element.

20. A two wire current transmitter for providing a direct current signal proportional to a condition to be measured comprising first and second terminals for connection to a direct current supply means; a series connected resistance network and a current controller connected between said first and second terminals, said current controller comprising first means connected to the resistance network to provide a current shunt path between said resistance network and said second terminal, and amplifier means having an input and an output, said amplifier means output being coupled to said first means to control the current through said shunt path as a function of a signal at said amplifier means input, and second means connected to said resistance network and said amplifier means to provide a signal at the input of said amplifier means which is a function of the current through said resistance network; and signal input stage means coupled to said resistance network and said current controller, said input stage means comprising third means to provide a reference signal, a variable reactance transducer, and an oscillator; said variable reactance transducer comprising a single variable capacitor having a capacitance value $C_1$, a reference capacitor having a capacitance value $C_2$, means coupling said oscillator to both of said capacitors to provide excitation current thereto, and fourth means connected to both of said capacitors to deliver a transducer output signal substantially proportional to the quantity $(C_2/C_1 - 1)$; and fifth means coupled to the input stage means and to the input of said amplifier means to provide a variable signal to the input of said amplifier means which is a function of the transducer output signal and the reference signal, said amplifier means thereby adjusting current through said shunt path and said second means in response to said variable signal.

21. The current transmitter of claim 20 and an oscillator control amplifier connected to said oscillator, and means to connect the output of the variable capacitor represented by capacitance $C_1$ to said oscillator control amplifier so that the signal from the oscillator to the variable capacitor is controlled as a function of the value of $C_1$.

22. The combination of claim 21 and means for providing a second reference signal to said oscillator control amplifier, and means connecting the output of the variable capacitor to the oscillator control amplifier so that the capacitor excitation magnitude varies inversely with the value of $C_1$.

23. The combination of claim 21 wherein said fourth means to deliver a transducer output signal includes means to subtract the output signal of the variable capacitor from the output signal of the reference capacitor to provide said transducer output signal substantially proportional to $$\frac{C_2}{C_1} - 1 .$$

* * * * *

UNITED STATES PATENT AND TRADEMARK OFFICE
CERTIFICATE OF CORRECTION

PATENT NO. : 3,975,719
DATED : August 17, 1976
INVENTOR(S) : Roger L. Frick

It is certified that error appears in the above-identified patent and that said Letters Patent are hereby corrected as shown below:

Column 3, line 55 "$R_{41\ (e)} + R_{42}$" should be -- $R_{41} + R_{42}$ --; Column 9, line 63, (Claim 17, line 5) after "sistor." insert -- , said second transistor having its base coupled to the output of said amplifier means.--; Column 10, line 63, (Claim 23, line 7) "$\frac{C_2}{C_1} - 1$" should be -- $\left(\frac{C_2}{C_1} - 1\right)$ --.

Signed and Sealed this

Twenty-sixth Day of October 1976

[SEAL]

Attest:

RUTH C. MASON
*Attesting Officer*

C. MARSHALL DANN
*Commissioner of Patents and Trademarks*